(12) United States Patent
Juang et al.

(10) Patent No.: US 12,476,621 B2
(45) Date of Patent: Nov. 18, 2025

(54) PHOTOELECTRIC SENSING DEVICE FOR CANCELLATE CROSSTALK

(71) Applicant: ELITE SEMICONDUCTOR MICROELECTRONICS TECHNOLOGY INC., Hsinchu (TW)

(72) Inventors: Dar-Chang Juang, Hsinchu (TW); Hung-Jui Ting, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 101 days.

(21) Appl. No.: 18/507,118

(22) Filed: Nov. 13, 2023

(65) Prior Publication Data

US 2024/0333264 A1  Oct. 3, 2024

(30) Foreign Application Priority Data

Mar. 30, 2023 (TW) .................... 112112230

(51) Int. Cl.
*H03K 19/00* (2006.01)
*H03K 3/013* (2006.01)
*H03K 3/0233* (2006.01)
*H03K 17/96* (2006.01)
*H03K 19/0185* (2006.01)

(52) U.S. Cl.
CPC ......... *H03K 3/013* (2013.01); *H03K 3/02337* (2013.01); *H03K 17/96* (2013.01); *H03K 19/018514* (2013.01)

(58) Field of Classification Search
CPC ... H03K 17/96; H03K 17/941; H03K 2217/96
See application file for complete search history.

(56) References Cited

U.S. PATENT DOCUMENTS

| | | | |
|---|---|---|---|
| 4,678,323 A | 7/1987 | Sato et al. | |
| 4,924,081 A * | 5/1990 | Arima | G01J 1/44 250/214 R |
| 5,448,056 A * | 9/1995 | Tsuruta | H03F 3/087 327/342 |
| 7,907,061 B2 | 3/2011 | Lin et al. | |
| 8,222,591 B2 * | 7/2012 | Lin | G01J 1/44 250/214 R |
| 8,283,620 B2 * | 10/2012 | Raynor | H03F 3/087 250/214 R |
| 8,848,202 B2 * | 9/2014 | Dyer | G01S 7/481 356/9 |
| 10,925,497 B2 * | 2/2021 | Trattler | A61B 5/7221 |

(Continued)

*Primary Examiner* — Tuan T Lam

(57) ABSTRACT

A photoelectric sensing device for cancelling crosstalk includes a first capacitor; a first switch, coupled between a current source and the first capacitor, is turned on according to a driving signal, and enables the current source to charge the first capacitor to generate a first capacitor voltage; a second switch, coupled between the first capacitor and an input terminal, is turned on according to a cancellation signal; a current-voltage conversion circuit, coupled to the second switch, receiving an input current corresponding to a crosstalk signal, and generating a crosstalk voltage corresponding to the input current. Wherein, when the second switch is turned on, the crosstalk voltage is subtracted from the first capacitor voltage to cancellate the crosstalk signal, so as to output a correct sensing voltage.

6 Claims, 8 Drawing Sheets

(56) References Cited

U.S. PATENT DOCUMENTS

| | | | | |
|---|---|---|---|---|
| 11,009,996 B2* | 5/2021 | Chen | ................... | G06F 1/1626 |
| 11,128,826 B2* | 9/2021 | Lenhard | ................ | H04N 25/70 |
| 11,361,717 B2* | 6/2022 | Lee | ................... | G09G 3/3275 |

* cited by examiner

PHOTOELECTRIC SENSING DEVICE FOR CANCELLATE CROSSTALK

CROSS-REFERENCE TO RELATED APPLICATION

This non-provisional application claims priority under 35 U.S.C. § 119(a) on Patent Application No(s). 112112230 filed in Taiwan, R.O.C. on Mar. 30, 2023, the entire contents of which are hereby incorporated by reference.

BACKGROUND OF THE INVENTION

1. Field of the Invention

The present disclosure relates to photoelectric sensing devices, and in particular to a photoelectric sensing device for canceling crosstalk.

2. Description of the Related Art

Photoelectric sensors are for use in detecting an object in accordance with optical properties, for example, to determine whether the object exists or whether the surface of the object has altered. Photoelectric sensors have advantages, such as long detection distance, short response time, high resolution, and non-contact, and thus are widely applicable to distance sensing technology.

The detection for the presence of an object, for example, entails emitting a light signal from an optical emitter (such as a light-emitting diode) to the surface of an object and receiving the reflected light signal with a photoelectric sensor to determine whether the object exists. In general, the protection for the optical emitter and the photoelectric sensor is usually provided by an encapsulated object or structure made of a light-penetrable material (for example, glass, clear epoxy resin or acrylic) and attained by stopping any foreign bodies from hitting the optical emitter and the photoelectric sensor.

However, when the light signal thus emitted passes through the structure or encapsulated object, interface reflection or total internal reflection occurs. Therefore, the photoelectric sensor not only receives a light signal that reflects off an object but also receives a light signal that reflects off a structure or an encapsulated object, leading to light signal crosstalk; as a result, the photoelectric sensor generates an incorrect sensing voltage, leading to circuit malfunction. Existing prior art about crosstalk cancellation adopts a structure design and requires an opaque cover structure whereby a light signal having reflected off a structure or an encapsulated object is prevented from traveling to the photoelectric sensor, with a view to eliminating light signal crosstalk.

BRIEF SUMMARY OF THE INVENTION

Although the prior art can eliminate light signal crosstalk, the required conventional cover structure takes up space and thus goes against the trend toward miniaturization.

In view of the aforesaid drawbacks of the prior art, it is an objective of the disclosure to provide a photoelectric sensing device for canceling crosstalk to not only solve the issue with light signal crosstalk but also get in line with the trend toward miniaturization by not taking up any space.

To achieve the above and other objectives, the disclosure provides a photoelectric sensing device for canceling crosstalk, comprising: a first capacitor; a first switch coupled between a current source and the first capacitor and configured to turn on according to a driving signal and enable the current source to charge the first capacitor to generate a first capacitor voltage; a second switch coupled between the first capacitor and an input terminal and configured to turn on according to a cancellation signal; and a current-voltage conversion circuit coupled to the second switch and configured to receive an input current corresponding to a crosstalk signal and a non-crosstalk signal to generate a crosstalk voltage corresponding to the input current. When the second switch turns on, the first capacitor voltage is subtracted from the crosstalk voltage to cancel the crosstalk signal, so as to output a correct sensing voltage.

In some embodiments, the current-voltage conversion circuit further comprises: an operational amplifier having an inverting input terminal, a non-inverting input terminal and an amplified output terminal, the inverting input terminal being coupled to the second switch, and the non-inverting input terminal being coupled to a rated voltage; a third switch coupled between the inverting input terminal and the amplified output terminal and configured to turn on or turn off according to a state of a reset signal; and a second capacitor coupled between the inverting input terminal and the amplified output terminal and configured to generate the crosstalk voltage.

In some embodiments, the amplified output terminal is further coupled to a sample-and-hold circuit comprising a fourth switch coupled between the amplified output terminal and a third capacitor, and the fourth switch turns on or turns off according to a state of a sample-and-hold signal to convert the sensing voltage into a digital signal.

In some embodiments, the photoelectric sensing device for canceling crosstalk further comprises a timing control circuit coupled to the first switch, the second switch, the third switch and the fourth switch to generate the reset signal, the driving signal, the cancellation signal and the sample-and-hold signal.

In some embodiments, the timing control circuit receives a pulse train signal, generates the cancellation signal with a pulse train according to the ON cycle of the driving signal, and sends the cancellation signal with the pulse train to the second switch.

In some embodiments, the second switch turns on at a rising edge of the cancellation signal with the pulse train.

In some embodiments, the photoelectric sensing device for canceling crosstalk further comprises an amplifier circuit and a Schmitt trigger circuit which are coupled between the first switch and the timing control circuit, allowing the timing control circuit to generate the cancellation signal with a pulse train according to the ON cycle of the driving signal and send the cancellation signal with the pulse train to the second switch.

In some embodiments, the second switch turns on at a rising edge of the cancellation signal with the pulse train.

Therefore, the photoelectric sensing device for canceling crosstalk according to the disclosure adopts the voltage cancellation technique that involves subtracting the crosstalk voltage from the initial sensing voltage to obtain a correct sensing voltage, solve the issue with crosstalk and reduce the chance of circuit malfunction. The photoelectric sensing device in the embodiments of the disclosure does not use any package structure to cancel the crosstalk signal and thus does not take up space, thereby being in line with the trend toward miniaturization. Moreover, in the embodiments of the disclosure, the cancellation signal with a pulse train controls the second switch to turn on or turn off to thereby not only effectively reduce the voltage of the capacitor for canceling crosstalk voltage but also prevent the capacitor from being overloaded, so as to enhance the overall stability of circuit operation. Furthermore, not only is the voltage of the capacitor for canceling crosstalk voltage effectively reduced, but the output voltage of the operational amplifier in the current-voltage conversion circuit is also reduced; thus, the current-voltage conversion circuit operates in a wider range, enhancing the sensing sensitivity of the photoelectric sensing device for canceling crosstalk.

DETAILED DESCRIPTION OF THE INVENTION

To facilitate understanding of the object, characteristics and effects of this present disclosure, embodiments together with the attached drawings for the detailed description of the present disclosure are provided.

Figure 1:
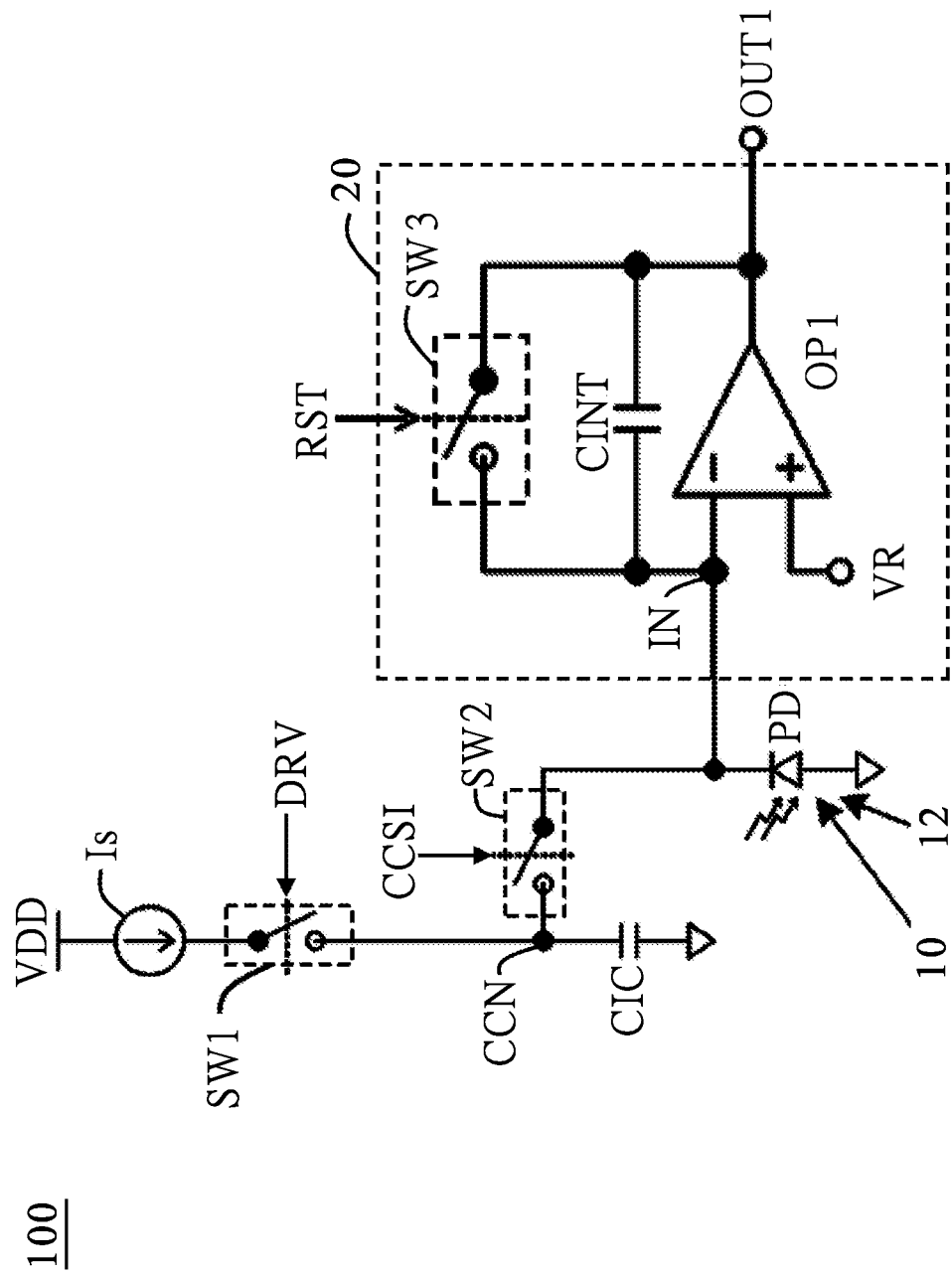
FIG. 1 is a schematic view of a photoelectric sensing device for canceling crosstalk according to an embodiment of the disclosure.

Referring to FIG. 1, there is shown a schematic view of a photoelectric sensing device 100 for canceling crosstalk according to an embodiment of the disclosure. The photoelectric sensing device 100 for canceling crosstalk comprises a first capacitor CIC, a first switch SW1, a second switch SW2 and a current-voltage conversion circuit 20.

One terminal of the first capacitor CIC is grounded. The other terminal of the first capacitor CIC is coupled to a node CCN. When the first switch SW1 turns on, the first capacitor CIC is charged according to current source Is.

The first switch SW1 is coupled between the current source Is and first capacitor CIC. A first terminal of the first switch SW1 connects to the current source Is. A second terminal of the first switch SW1 connects to the node CCN. A third terminal of the first switch SW1 receives a driving signal DRV. A terminal of the current source Is connects to a high-power voltage VDD. Another terminal of the current source Is connects to the first switch SW1. The first switch SW1 turns on according to the driving signal DRV and causes the current source Is to charge the first capacitor CIC so as to generate a first capacitor voltage. For example, the first switch SW1 turns on at the rising edge of the driving signal DRV, allowing the current source Is to charge the first capacitor CIC so as to generate the first capacitor voltage. By contrast, the first switch SW1 turns off at the falling edge of the driving signal DRV, and thus the current source Is stops charging the first capacitor CIC.

The second switch SW2 is coupled between the first capacitor CIC and an input terminal IN. The second switch SW2 turns on according to a cancellation signal CCSI. For example, the second switch SW2 turns on at the rising edge of the cancellation signal CCSI but turns off at the falling edge of the cancellation signal CCSI.

The current-voltage conversion circuit 20 is coupled to the second switch SW2. The current-voltage conversion circuit 20 is further coupled to a photoelectric sensor PD. The photoelectric sensor PD generates a sensing current according to a first light ray 10 and a second light ray 12. The first light ray 10 can be regarded as a light signal (i.e., the source of a crosstalk signal) that reflects off a structure or an encapsulated object. The second light ray 12 can be regarded as a light signal (i.e., a non-crosstalk signal) that reflects off an object. After receiving the first light ray 10, the photoelectric sensor PD generates a corresponding input current and feeds it to the input terminal IN. After receiving the second light ray 12, the photoelectric sensor PD generates a corresponding sensing current and feeds it to the input terminal IN. In practice, when no object exists but the photoelectric sensor PD can receive a reflected light signal, the reflected light signal is defined as a "crosstalk signal." The current-voltage conversion circuit 20 receives an input current corresponding to the crosstalk signal and generates a crosstalk voltage corresponding to the input current. The first switch SW1 and the second switch SW2 are P-type Metal-Oxide-Semiconductor Field-Effect Transistors (P-type MOSFET) or N-type Metal-Oxide-Semiconductor Field-Effect Transistors (N-type MOSFET).

The current-voltage conversion circuit 20 comprises an operational amplifier OP1, a third switch SW3 and a second capacitor CINT. The operational amplifier OP1 has an inverting input terminal, a non-inverting input terminal and an amplified output terminal. The inverting input terminal is coupled to the second switch SW2, the input terminal IN, and a cathode of the photoelectric sensor PD. The non-inverting input terminal is coupled to a rated voltage VR. The third switch SW3 is coupled between the inverting input terminal and the amplified output terminal. The third switch SW3 turns on or turns off according to the state of a reset signal RST. For example, third switch SW3 turns on at the rising edge of the reset signal RST but turns off at the falling edge of the reset signal RST. The third switch SW3 is a P-type MOSFET or an N-type MOSFET. The second capacitor CINT is coupled between the inverting input terminal and the amplified output terminal. The second capacitor CINT generates a crosstalk voltage. The second capacitor CINT is charged according to the input current of the crosstalk signal, so as to generate the crosstalk voltage.

Figure 2:
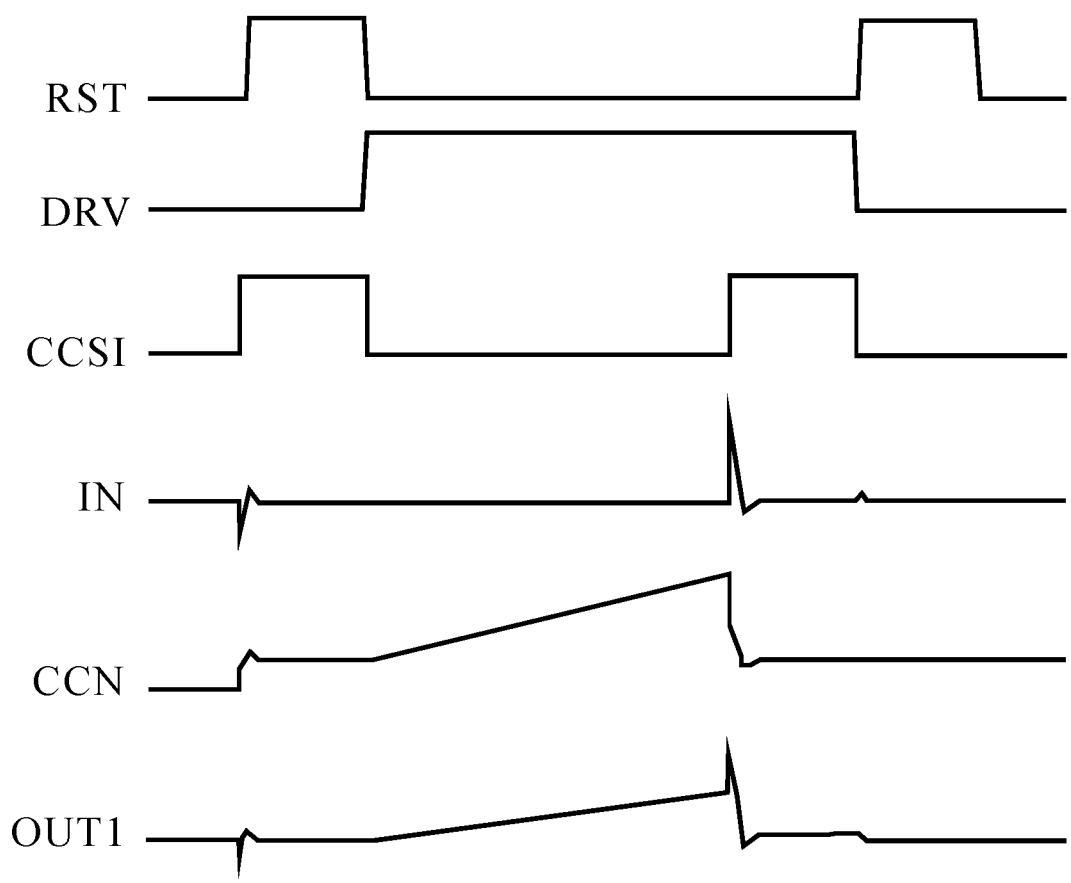
FIG. 2 is a signal timing diagram based on FIG. 1 illustrated by its embodiment of the disclosure.

Referring to FIG. 2, there is shown a signal timing diagram based on FIG. 1 illustrated by its embodiment of the disclosure. The circuit operation principle of the photoelectric sensing device 100 for canceling crosstalk is illustrated by FIG. 2 is described below. The rising edge of the reset signal RST causes the third switch SW3 to turn on and causes the second capacitor CINT to discharge and thus release stored electrical energy to the rated voltage VR, thereby allowing the voltage of the input terminal IN to return to the rated voltage VR.

Afterward, the rising edge of the driving signal DRV causes the first switch SW1 to turn on; thus, the current source Is charges the first capacitor CIC, and the first capacitor voltage is generated at the node CCN. During the time period of several microseconds (µs) immediately before the driving signal DRV ends, the cancellation signal CCSI rises to a high voltage level to cause the second switch SW2 to turn on; thus, the first capacitor voltage is fed to the input terminal IN, allowing the crosstalk voltage to be subtracted from the first capacitor voltage. Under the crosstalk voltage, a crosstalk current is generated as soon as the photoelectric sensor PD receives the first light ray 10. The current-voltage conversion circuit 20 converts the crosstalk current into the crosstalk voltage. Therefore, when the second switch SW2 turns on, the first capacitor voltage is subtracted from the crosstalk voltage to cancel the crosstalk signal, allowing a sensing voltage to be outputted.

Therefore, the voltage cancellation technique used in the embodiment illustrated by FIG. 1 according to the disclosure involves subtracting the crosstalk voltage from the initial sensing voltage to obtain a correct sensing voltage, solve the issue with crosstalk and reduce the chance of circuit malfunction. The photoelectric sensing device in the embodiment illustrated by FIG. 1 according to the disclosure does not use any package structure to cancel the crosstalk signal and thus does not take up space, thereby being in line with the trend toward miniaturization.

Figure 3:
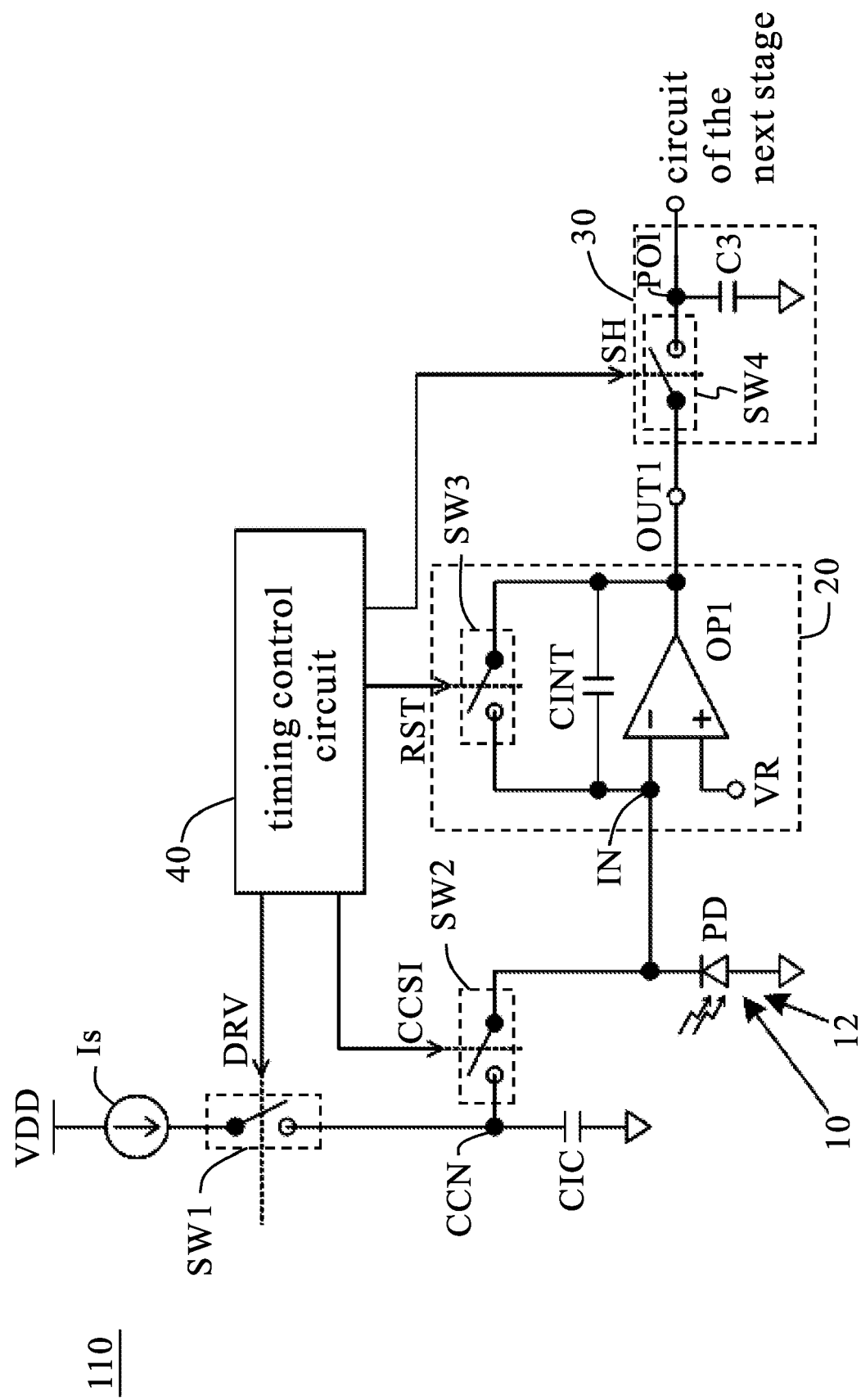
FIG. 3 is a schematic view of a photoelectric sensing device for canceling crosstalk according to another embodiment of the disclosure.

Referring to FIG. 3, there is shown a schematic view of a photoelectric sensing device 110 for canceling crosstalk according to another embodiment of the disclosure. The photoelectric sensing device 110 for canceling crosstalk comprises a first capacitor CIC, a first switch SW1, a second switch SW2, a current-voltage conversion circuit 20, a sample-and-hold circuit 30 and a timing control circuit 40. Unlike the embodiment illustrated by FIG. 1, the embodiment illustrated by FIG. 3 has the distinguishing technical features below. The output terminal OUT1 of the current-voltage conversion circuit 20 is further coupled to the sample-and-hold circuit 30. The timing control circuit 40 is coupled to the first switch SW1, the second switch SW2, the third switch SW3 and the fourth switch SW4. The timing control circuit 40 generates a reset signal RST, a driving signal DRV, a cancellation signal CCSI and a sample-and-hold signal SH.

The sample-and-hold circuit 30 comprises the fourth switch SW4 and a third capacitor C3. The fourth switch SW4 is coupled between the amplified output terminal and the third capacitor C3. A first terminal of the fourth switch SW4 connects to the output terminal OUT1. A second terminal of the fourth switch SW4 connects to a node PO1. A third terminal of the fourth switch SW4 receives the sample-and-hold signal SH. A fourth switch SW4 is a P-type MOSFET or an N-type MOSFET. The fourth switch SW4 turns on or turns off according to the state of the sample-and-hold signal SH, converts a sensing voltage outputted from operational amplifier OP1 into a digital signal, and provides the digital signal to a circuit of the next stage for subsequent use. For example, the fourth switch SW4 turns on at the rising edge of the sample-and-hold signal SH so as to charge the third capacitor C3. By contrast, the fourth switch SW4 turns off at the falling edge of the sample-and-hold signal SH so that the capacitor voltage (corresponding to the voltage at the node PO1) of the third capacitor C3 can be read by the circuit of the next stage.

Figure 4:
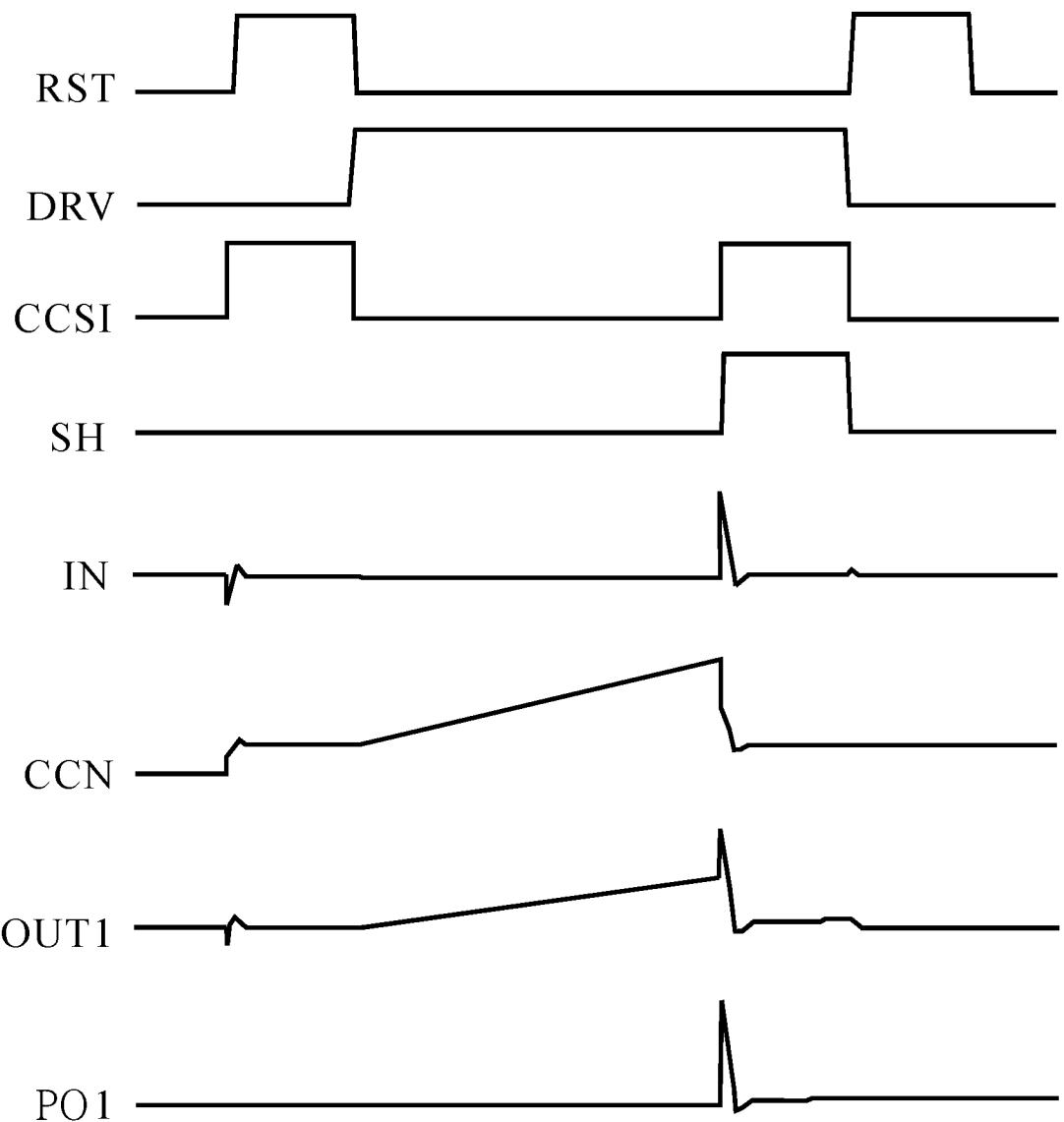
FIG. 4 is a signal timing diagram based on FIG. 3 illustrated by its embodiment of the disclosure.

Referring to FIG. 4, there is shown a signal timing diagram based on FIG. 3 illustrated by its embodiment of the disclosure. The circuit operation principle of the photoelectric sensing device 110 for canceling crosstalk as shown in FIG. 4 is similar to that in FIG. 1 and thus is not reiterated. Similarly, the photoelectric sensing device for canceling crosstalk in the embodiment illustrated by FIG. 3 according to the disclosure adopts the voltage cancellation technique that involves subtracting the crosstalk voltage from the initial sensing voltage to obtain a correct sensing voltage, solve the issue with crosstalk and reduce the chance of circuit malfunction. The photoelectric sensing device in the embodiment illustrated by FIG. 3 according to the disclosure does not use any package structure to cancel the crosstalk signal and thus does not take up space, thereby being in line with the trend toward miniaturization.

Figure 5:
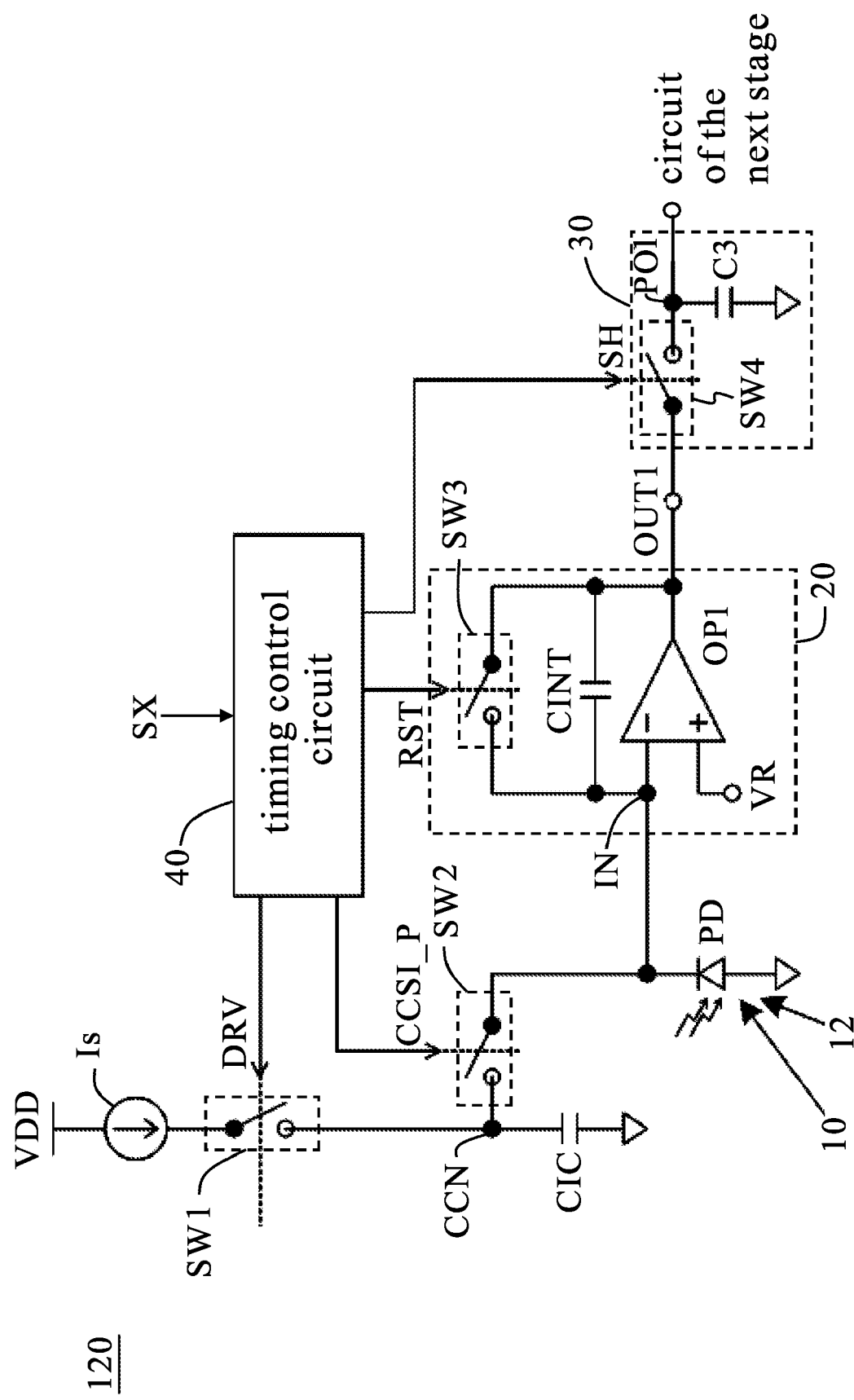
FIG. 5 is a schematic view of a photoelectric sensing device for canceling crosstalk according to yet another embodiment of the disclosure.

Referring to FIG. 5, there is shown a schematic view of a photoelectric sensing device 120 for canceling crosstalk according to yet another embodiment of the disclosure. The photoelectric sensing device 120 for canceling crosstalk comprises a first capacitor CIC, a first switch SW1, a second switch SW2, a current-voltage conversion circuit 20, a sample-and-hold circuit 30 and a timing control circuit 40. Unlike the embodiment illustrated by FIG. 3, the embodiment illustrated by FIG. 5 has the distinguishing technical feature below. The timing control circuit 40 further receives a pulse train signal SX, generates a cancellation signal CCSI_P with a pulse train according to the ON cycle of a driving signal DRV, and sends the cancellation signal CCSI_P with the pulse train to the second switch SW2.

Figure 6:
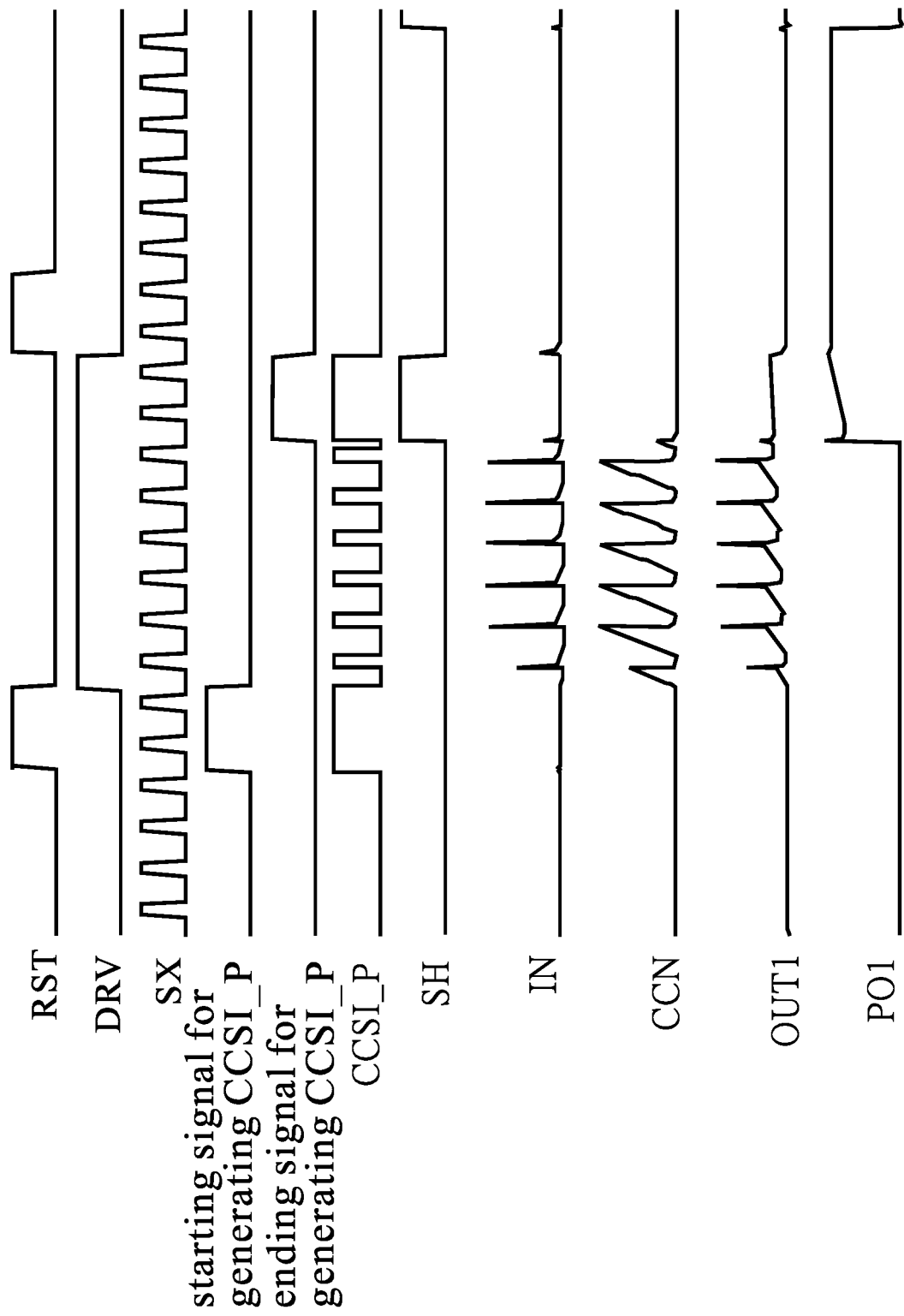
FIG. 6 is a signal timing diagram based on FIG. 5 illustrated by its embodiment of the disclosure.

Referring to FIG. 6, there is shown a signal timing diagram based on FIG. 5 illustrated by its embodiment of the disclosure. The circuit operation principle of the photoelectric sensing device 120 for canceling crosstalk as shown in FIG. 6 is similar to that in FIG. 3 except for the following: the pulse train signal SX and the driving signal DRV combine to form the cancellation signal CCSI_P with the pulse train, and the second switch SW2 turns on or turns off according to the cancellation signal CCSI_P with the pulse train. For example, the second switch SW2 turns on at the rising edge of the cancellation signal CCSI_P with the pulse train. The second switch SW2 turns off at the falling edge of the cancellation signal CCSI_P with the pulse train.

The cancellation signal CCSI_P with the pulse train causes the second switch SW2 to turn on more often such that the capacitor voltage (corresponding to the voltage at the node CCN) of the first capacitor CIC can be more rapidly read to an input terminal IN. Therefore, the first capacitor CIC is effectively prevented from being overloaded, allowing the photoelectric sensing device 120 for canceling crosstalk to be stabler. Moreover, owing to the cancellation signal CCSI_P with the pulse train, not only is the voltage of the first capacitor CIC effectively reduced, but the voltage signals at node CCN and output terminal OUT1 are also reduced; thus, the current-voltage conversion circuit 20 operates in a wider range, enhancing the sensing sensitivity of the photoelectric sensing device 120 for canceling crosstalk.

Figure 7:
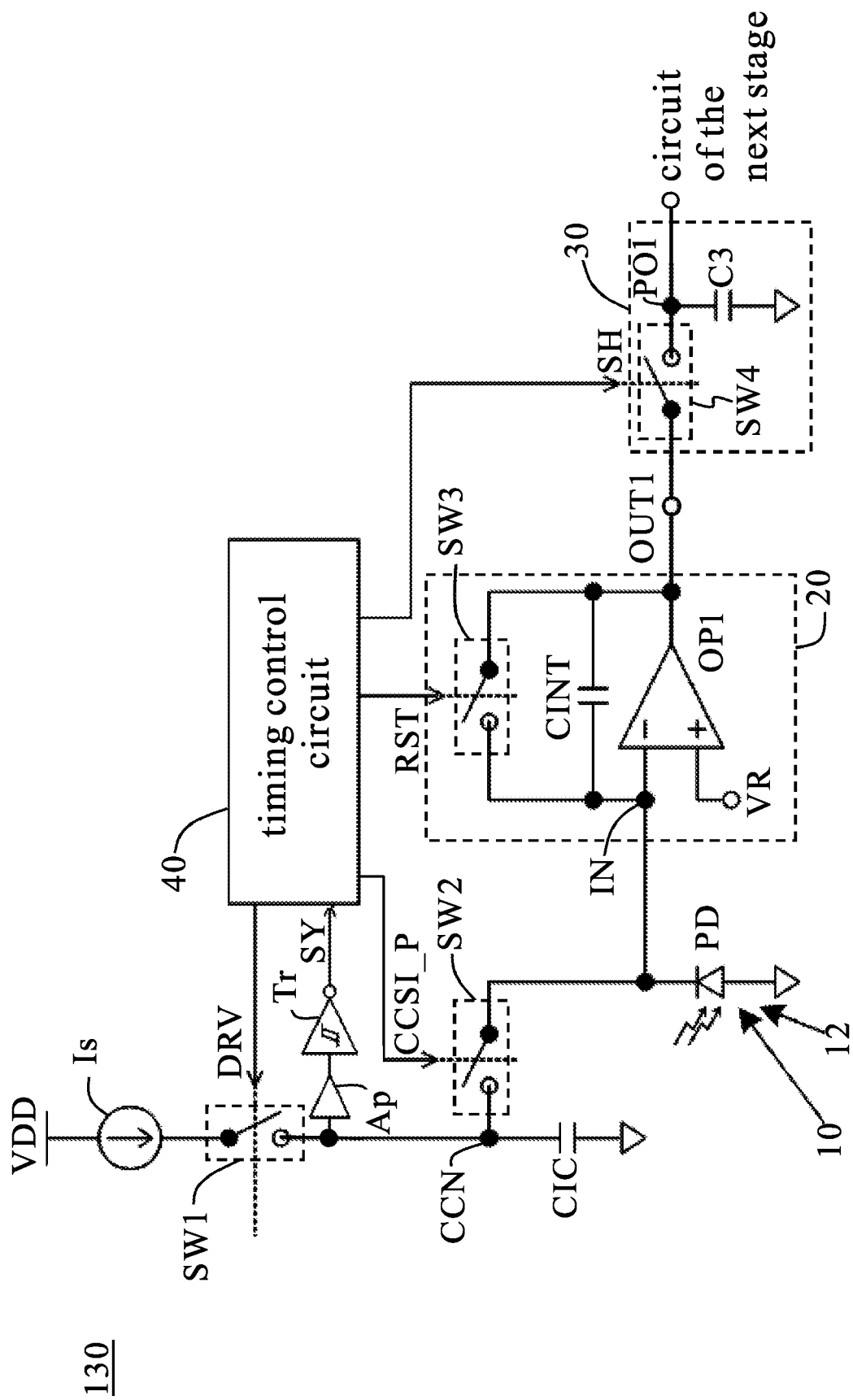
FIG. 7 is a schematic view of a photoelectric sensing device for canceling crosstalk according to still yet another embodiment of the disclosure.

Referring to FIG. 7, there is shown a schematic view of a photoelectric sensing device 130 for canceling crosstalk according to still yet another embodiment of the disclosure. The photoelectric sensing device 130 for canceling crosstalk comprises a first capacitor CIC, a first switch SW1, a second switch SW2, a current-voltage conversion circuit 20, a sample-and-hold circuit 30, a timing control circuit 40, an amplifier circuit Ap and a Schmitt trigger circuit Tr. An input terminal of the amplifier circuit Ap connects to the second terminal of the first switch SW1. An output terminal of the amplifier circuit Ap connects to an input terminal of the Schmitt trigger circuit Tr. An output terminal of the Schmitt trigger circuit Tr connects to the timing control circuit 40.

Figure 8:
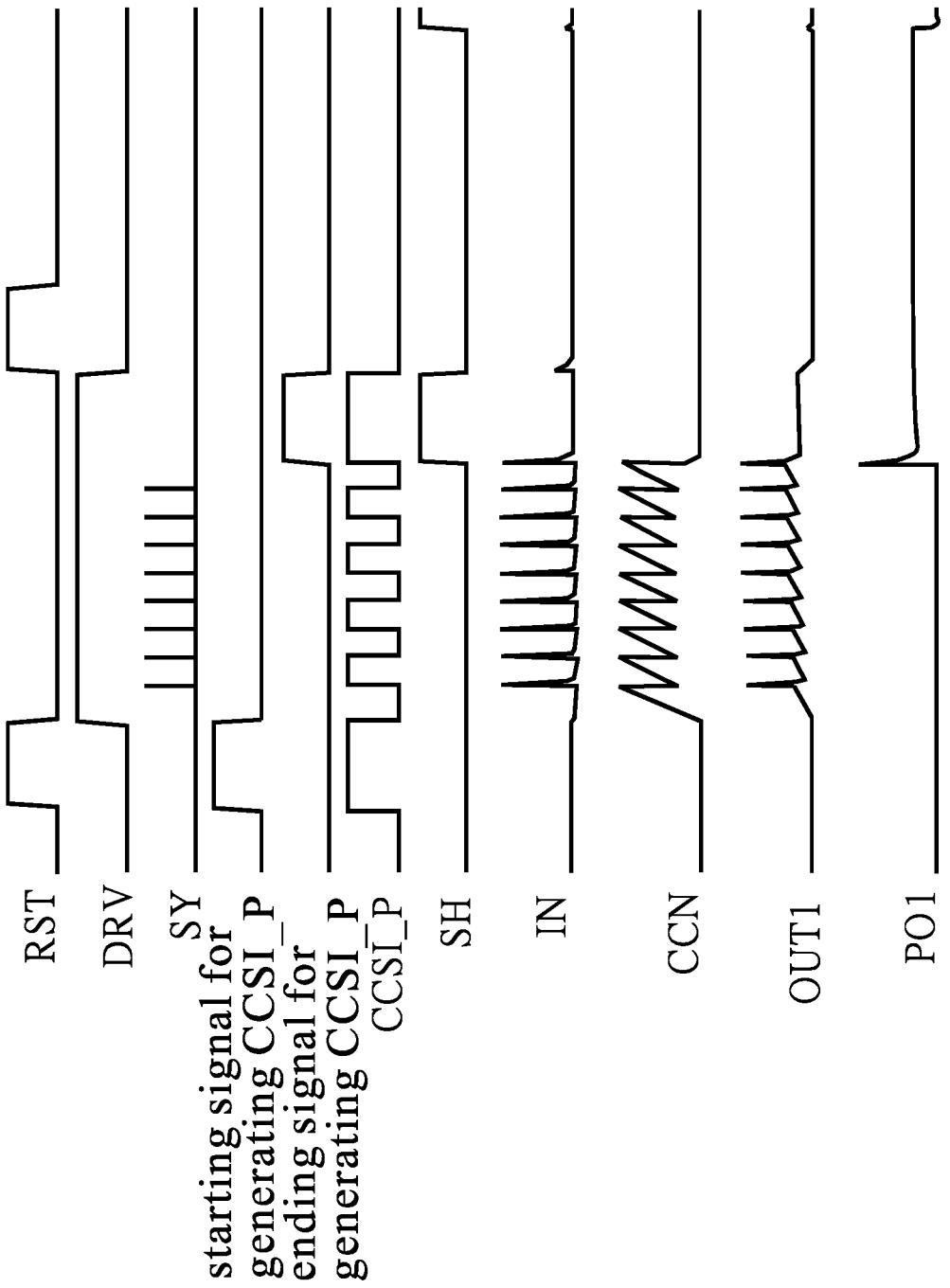
FIG. 8 is a signal timing diagram based on FIG. 7 illustrated by its embodiment of the disclosure.

Referring to FIG. 8, there is shown a signal timing diagram based on FIG. 7 illustrated by its embodiment of the disclosure. The circuit operation principle of the photoelectric sensing device 130 for canceling crosstalk as shown in FIG. 8 is distinguished from that in FIG. 5 by the technical features described below. The amplifier circuit Ap and the Schmitt trigger circuit Tr are coupled between the first switch SW1 and the timing control circuit 40. The amplifier circuit Ap and the Schmitt trigger circuit Tr generate a pulse train signal SY according to the ON cycle of the driving signal DRV and send the pulse train signal SY to the timing control circuit 40; thus, the timing control circuit 40 generates and sends the cancellation signal CCSI_P with the pulse train to the second switch SW2. The pulse train signal SY is generated inside the photoelectric sensing device 130 for canceling crosstalk and adapted to allow a capacitor voltage (corresponding to the voltage at the node CCN) of the first capacitor CIC to be more rapidly read to the input terminal IN. Therefore, the first capacitor CIC is effectively prevented from being overloaded, allowing the photoelectric sensing device 120 for canceling crosstalk to be stabler.

In conclusion, the photoelectric sensing device for canceling crosstalk according to the disclosure adapts the voltage cancellation technique that involves subtracting the crosstalk voltage from the initial sensing voltage to obtain a correct sensing voltage, solve the issue with crosstalk and reduce the chance of circuit malfunction. The photoelectric sensing device in the embodiments of the disclosure does not use any package structure to cancel the crosstalk signal and thus does not take up space, thereby being in line with the trend toward miniaturization. Moreover, in the embodiments of the disclosure, the cancellation signal with a pulse train controls the second switch to turn on or turn off to thereby not only effectively reduce the voltage of the capacitor for canceling crosstalk voltage but also prevent the capacitor from being overloaded, so as to enhance the overall stability of circuit operation. Furthermore, not only is the voltage of the capacitor for canceling crosstalk voltage effectively reduced, but the output voltage of the operational amplifier in the current-voltage conversion circuit is also reduced; thus, the current-voltage conversion circuit operates in a wider range, enhancing the sensing sensitivity of the photoelectric sensing device for canceling crosstalk.

The invention is disclosed above by preferred embodiments. However, persons skilled in the art should understand that the preferred embodiments are illustrative of the invention only, but should not be interpreted as restrictive of the scope of the invention. Hence, all equivalent modifications and replacements made to the aforesaid embodiments should fall within the scope of the invention. Accordingly, the legal protection for the invention should be defined by the appended claims.

What is claimed is:

1. A photoelectric sensing device for canceling crosstalk, comprising:
   a first capacitor;
   a first switch coupled between a current source and the first capacitor and configured to turn on according to a driving signal and enable the current source to charge the first capacitor to generate a first capacitor voltage;
   a second switch coupled between the first capacitor and an input terminal and configured to turn on according to a cancellation signal; and
   a current-voltage conversion circuit coupled to the second switch and configured to receive an input current corresponding to a crosstalk signal and a non-crosstalk signal to generate a crosstalk voltage corresponding to the input current,
   wherein, when the second switch turns on, the crosstalk voltage is subtracted from the first capacitor voltage to cancel the crosstalk signal, so as to output a sensing voltage;
   wherein the current-voltage conversion circuit further comprises:
     an operational amplifier having an inverting input terminal, a non-inverting input terminal and an amplified output terminal, the inverting input terminal being coupled to the second switch, and the non-inverting input terminal being coupled to a rated voltage;
     a third switch coupled between the inverting input terminal and the amplified output terminal and configured to turn on or turn off according to a state of a reset signal; and
     a second capacitor coupled between the inverting input terminal and the amplified output terminal and configured to generate the crosstalk voltage; and
   wherein the amplified output terminal is further coupled to a sample-and-hold circuit comprising a fourth switch coupled between the amplified output terminal and a third capacitor, and the fourth switch turns on or turns off according to a state of a sample-and-hold signal to convert the sensing voltage into a digital signal.

2. The photoelectric sensing device for canceling crosstalk of claim 1, further comprising a timing control circuit coupled to the first switch, the second switch, the third switch and the fourth switch to generate the reset signal, the driving signal, the cancellation signal and the sample-and-hold signal.

3. The photoelectric sensing device for canceling crosstalk of claim 2, wherein the timing control circuit receives a pulse train signal, generates the cancellation signal with a pulse train according to an ON cycle of the driving signal, and sends the cancellation signal with the pulse train to the second switch.

4. The photoelectric sensing device for canceling crosstalk of claim 3, wherein the second switch turns on at a rising edge of the cancellation signal with the pulse train.

5. The photoelectric sensing device for canceling crosstalk of claim 2, further comprising an amplifier circuit and a Schmitt trigger circuit which are coupled between the first switch and the timing control circuit, allowing the timing control circuit to generate the cancellation signal with a pulse train according to an ON cycle of the driving signal and send the cancellation signal with the pulse train to the second switch.

6. The photoelectric sensing device for canceling crosstalk of claim 5, wherein the second switch turns on at a rising edge of the cancellation signal with the pulse train.

\* \* \* \* \*